United States Patent
Yeh

(10) Patent No.: US 10,527,887 B2
(45) Date of Patent: Jan. 7, 2020

(54) LED DISPLAY DEVICE, HAS FLEXIBLE CIRCUIT BOARD COMPRISING MAIN AND EXTENSION PORTIONS, WHERE MAIN PORTION IS ARRANGED ON FIRST SURFACE AND EXTENSION PORTION IS ARRANGED ON SECOND SURFACE, AND LIGHT-EMITTING UNITS ARRANGED ON MAIN PORTION

(71) Applicant: InnoLux Corporation, Miao-Li County (TW)

(72) Inventor: Hu-Shun Yeh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/980,672

(22) Filed: May 15, 2018

(65) Prior Publication Data

US 2018/0356686 A1  Dec. 13, 2018

(30) Foreign Application Priority Data

Jun. 12, 2017 (CN) .......................... 2017 1 0440036

(51) Int. Cl.
*G02F 1/1335* (2006.01)
*G02F 1/13357* (2006.01)
*H05K 1/14* (2006.01)
*H05K 1/02* (2006.01)
*H05K 3/00* (2006.01)
(Continued)

(52) U.S. Cl.
CPC .. *G02F 1/133608* (2013.01); *G02F 1/133603* (2013.01); *H05K 1/0203* (2013.01); *H05K 1/142* (2013.01); *H05K 3/0061* (2013.01); *H05K 7/20963* (2013.01); *G02F 1/133308* (2013.01); *G02F 2001/133314* (2013.01); *G02F 2001/133331* (2013.01); *G02F 2001/133612* (2013.01); *G02F 2001/133628* (2013.01); *H05K 1/189* (2013.01); *H05K 2201/056* (2013.01);
(Continued)

(58) Field of Classification Search
CPC ......... G02F 1/133603; G02F 1/133608; G02F 2001/133628; H05K 1/189; F21V 19/003; F21V 19/0035; F21V 19/004; F21V 19/0045
See application file for complete search history.

(56) References Cited

U.S. PATENT DOCUMENTS 7,175,329 B1 * 2/2007 Chou ........................ F21K 9/00
362/612
7,607,790 B2 * 10/2009 Chen ................ G02F 1/133603
174/252
(Continued)

*Primary Examiner* — Robert J May
(74) *Attorney, Agent, or Firm* — Winston Hsu

(57) ABSTRACT

A display device includes a display panel and a backlight module disposed adjacent to the display panel. The backlight module includes a heat dissipating plate, a flexible circuit board disposed on the heat dissipating plate, and a plurality of light-emitting units disposed on the flexible circuit board. In some embodiments, the heat dissipating plate has a slit. The flexible circuit board can pass through the slit so as to be disposed at two opposite surfaces of the heat dissipating plate. In some embodiments, the surface of the heat dissipating plate toward the display panel thereon forms an indentation structure. A driver unit of the flexible circuit board can be disposed in the indentation structure.

10 Claims, 15 Drawing Sheets

(51) Int. Cl.
  *H05K 7/20*    (2006.01)
  *H05K 1/18*    (2006.01)
  *G02F 1/1333*  (2006.01)

(52) U.S. Cl.
  CPC .............. *H05K 2201/066* (2013.01); *H05K 2201/10106* (2013.01); *H05K 2201/10136* (2013.01)

(56)        References Cited

U.S. PATENT DOCUMENTS

| | | | |
|---|---|---|---|
| 8,619,211 B2 * | 12/2013 | Bertram | F21K 9/00 |
| | | | 349/61 |
| 8,684,550 B2 * | 4/2014 | Cho | F21V 29/00 |
| | | | 362/218 |
| 8,829,776 B2 * | 9/2014 | Yamamoto | H01L 25/0753 |
| | | | 313/498 |
| 9,523,473 B2 * | 12/2016 | Ackermann | B60Q 1/085 |

\* cited by examiner

LED DISPLAY DEVICE, HAS FLEXIBLE CIRCUIT BOARD COMPRISING MAIN AND EXTENSION PORTIONS, WHERE MAIN PORTION IS ARRANGED ON FIRST SURFACE AND EXTENSION PORTION IS ARRANGED ON SECOND SURFACE, AND LIGHT-EMITTING UNITS ARRANGED ON MAIN PORTION

BACKGROUND OF THE DISCLOSURE

1. Field of the Disclosure

The disclosure relates to a display device, and especially relates to a display device with direct backlight.

2. Description of the Prior Art

Displays with direct backlight usually need more light-emitting units, for example but not limited to light-emitting diode (LED). The LEDs are usually disposed on a flexible circuit board, which is disposed on a heat dissipating plate, so that the LEDs can be arranged flatly and cooled through the heat dissipating plate. For a higher brightness, the display would use a high disposition density of LEDs. As the disposition density of LEDs increases, the quantity of driver chips for driving and controlling the LEDs increases. If the driver chips and the corresponding LEDs are disposed at the same side of the heat dissipating plate, maybe the LEDs cannot be arranged flatly on the heat dissipating plate, which leads to unevenness and also reduces the heat dissipation efficiency of the heat dissipating plate to the LEDs.

SUMMARY OF THE DISCLOSURE

According to an embodiment of the disclosure, a display device includes a backlight module and a display panel. The display panel is disposed on the backlight module. The backlight module includes a heat dissipating plate, a flexible circuit board, and a plurality of light-emitting units. The heat dissipating plate has a first surface toward the display panel, and a second surface opposite to the first surface. The flexible circuit board includes a main portion and a first extension portion. The first main portion is disposed on the first surface. The first extension portion is disposed on the second surface. The light-emitting units are disposed on the first main portion.

According to another embodiment of the disclosure, a display device includes a backlight module and a display panel. The display panel is disposed on the backlight module. The backlight module includes a heat dissipating plate, a flexible circuit board, a plurality of light-emitting units, and a driver unit. The heat dissipating plate has a first surface toward the display panel, a second surface opposite to the first surface, and an indentation structure on the first surface. The flexible circuit board has a third surface toward the display panel, and a fourth surface opposite to the third surface. The light-emitting units are disposed on the third surface. The driver unit is disposed on the fourth surface and in the indentation structure.

These and other objectives of the present disclosure will no doubt become obvious to those of ordinary skill in the art after reading the following detailed description of the embodiment that is illustrated in the various figures and drawings.

DETAILED DESCRIPTION

Figure 1:
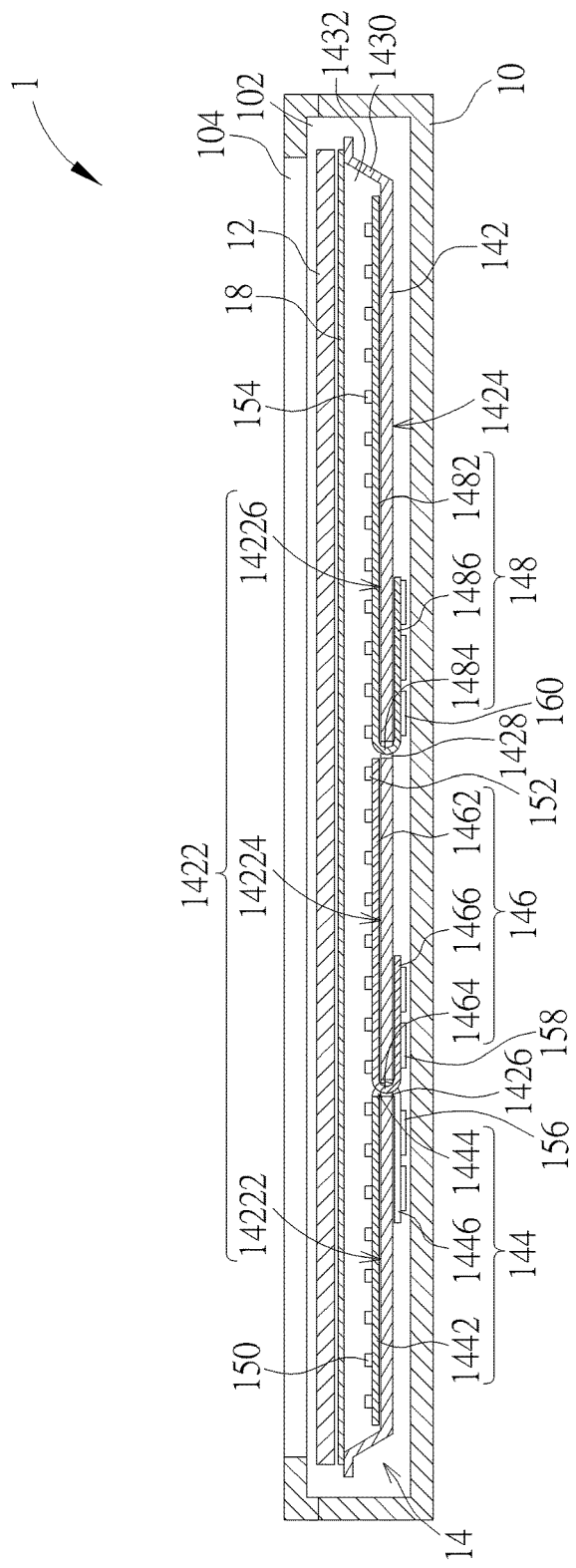
FIG. 1 is a sectional view of a display device according to an embodiment.

Please refer to FIG. 1 to FIG. 5. A display device 1 according to an embodiment includes a casing 10, a display panel 12, a backlight module 14, and an optical film 18. The casing 10 has an accommodating space 102 for accommodating the display panel 12, the backlight module 14, and the optical film 18. The display panel 12 is exposed out through a window 104 of the casing 10. The backlight module 14 is disposed adjacent to the display panel 12 for providing backlight to the display panel 12. The optical film 18 is disposed between the display panel 12 and the backlight module 14. Therein, in practice, the display panel 12 and the optical film 18 are multilayer structures. For simplification of the drawings, the display panel 12 and the optical film 18 are shown individually by a solid structure, of which the interior structure can be realized by a common display panel (for example but not limited to a liquid crystal display panel) and an optical film (for example including but not limited thereto brightness enhancement film, diffusion film and so on) respectively, which will not be described in detail herein.

The backlight module 14 includes a heat dissipating plate 142, a first flexible circuit board 144, a second flexible circuit board 146, a third flexible circuit board 148, a plurality of first light-emitting units 150, a plurality of second light-emitting units 152, a plurality of third light-emitting units 154, at least one first driver unit 156, at least one second driver unit 158, and at least one third driver unit 160. Therein, the first light-emitting units 150, the second light-emitting units 152, and the third light-emitting units 154 can be but not limited to light-emitting diodes. The first driver unit 156, the second driver unit 158, and the third driver unit 160 can be but not limited to a driver chip.

The first light-emitting units 150 are disposed on the front of the first flexible circuit board 144. The second light-emitting units 152 are disposed on the front of the second flexible circuit board 146. The third light-emitting units 154 are disposed on the front of the third flexible circuit board 148. Thereby, the backlight module 14 with such light-emitting units can be combined to the display panel 12 to obtain a display device with direct backlight.

The heat dissipating plate 142 has a first surface 1422 toward the display panel 12, a second surface 1424 opposite to the first surface 1422, and a first slit 1426 and a second slit 1428 which pass through the first surface 1422 and the second surface 1424. The first surface 1422 has a first area 14222, a second area 14224, and a third area 14226. The second area 14224 is located between the first area 14222 and the third area 14226. The first slit 1426 is located between the first area 14222 and the second area 14224 and extends along a first direction D1 (indicated by an arrow). The second slit 1428 is located between the second area 14224 and the third area 14226 and extends along the first direction D1. On the whole, the first surface 1422 is substantially divided by the first slit 1426 and the second slit 1428 into the first area 14222, the second area 14224, and the third area 14226.

The first flexible circuit board 144 includes a first main portion 1442, a first connection portion 1444, and a first extension portion 1446. The first connection portion 1444 extends from the first main portion 1442; then, the first extension portion 1446 extends from the first connection portion 1444. In other words, the first connection portion 1444 connects the first main portion 1442 and the first extension portion 1446. The first main portion 1442 is disposed on the first area 14222. The first connection portion 1444 passes through the first slit 1426. The first extension portion 1446 is disposed on the second surface 1424. The first light-emitting units 150 are disposed on the first main portion 1442 toward the display panel 12. The at least one first driver unit 156 is disposed on the first extension portion 1446 and is electrically connected to the first light-emitting units 150 through the first connection portion 1444, so that the at least one first driver unit 156 can drive and control the first light-emitting units 150 to emit light.

Figure 2:
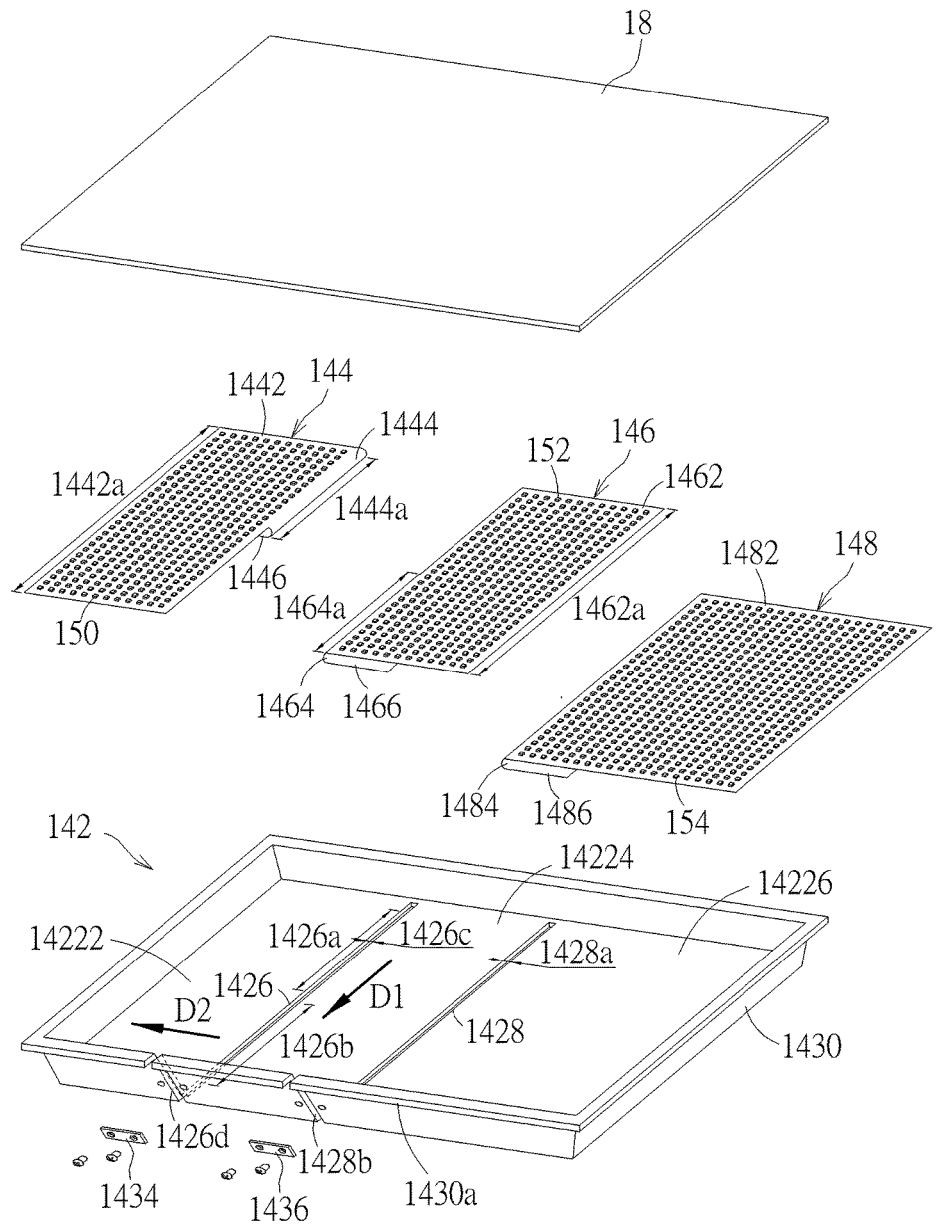
FIG. 2 is an exploded view of a backlight module in FIG. 1.
Figure 4:
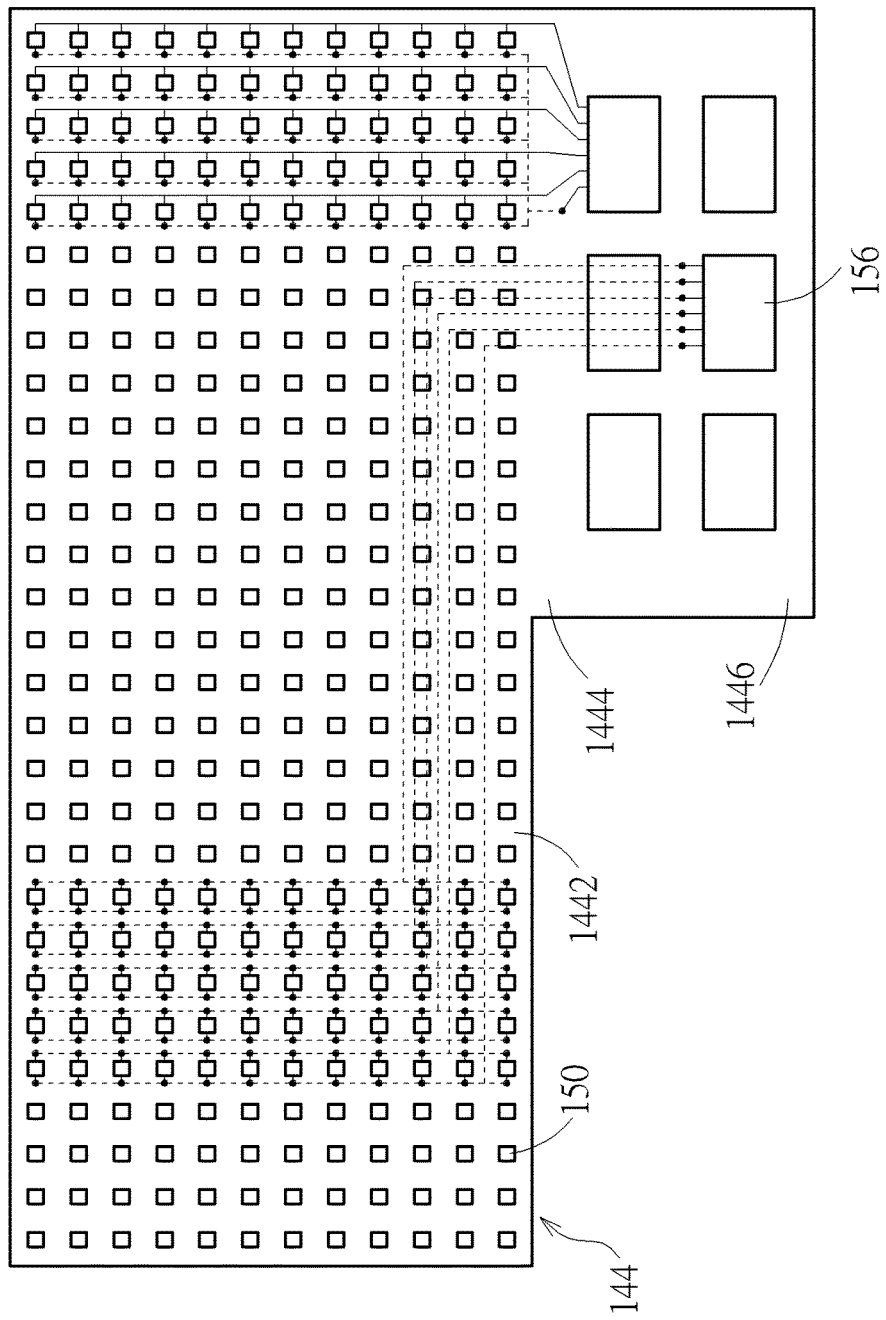
FIG. 4 is a schematic diagram illustrating that first light-emitting units and first driver units are disposed on a first flexible circuit board.
Figure 5:
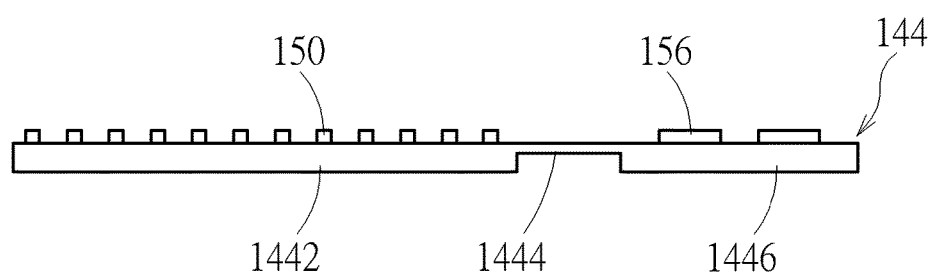
FIG. 5 is a side view of the first flexible circuit board in FIG. 4.

According to some embodiments, the first flexible circuit board 144 can be a multilayer sheet, i.e. formed by staggering and stacking a plurality of insulation layers (for example but not limited to polyamide layers) and a plurality of conductive layers (for example but not limited there to copper layers). The conductive layers are connected to form circuitry. In another aspect, the circuitry can distribute on different conductive layers and is connected through vias. As shown by FIG. 4 (in which the first flexible circuit board 144 is shown in an expansion diagram in the figure), the first light-emitting units 150 are all disposed on the surface of the first main portion 1442, so that the residual portion of the surface of the first main portion 1442 is insufficient for all first light-emitting units 150 to be electrically connected to the corresponding first driver unit 156 through the residual portion. Therefore, some of the first light-emitting units 150 are electrically connected to the corresponding first driver unit 156 through the circuitry formed on the inner conductive layers (shown in dashed lines in FIG. 4); therein, the circuitry for electrically connecting these first light-emitting units 150 expands on different conductive layers through vias (shown by spots in FIG. 4). Therein, for simplification of the drawing, in FIG. 4, only a portion of the circuitry for some of the first light-emitting units 150 is shown. Furthermore, in principle, the first connection portion 1444 is used for the circuitry to pass through, so the width of the first flexible circuit board 144 at the first connection portion 1444 can be reduced. In the embodiment, as shown by FIG. 2, the width 1442a of the first main portion 1442 in the first direction D1 is larger than the width 1444a of the first connection portion 1444 in the first direction D1. As shown by FIG. 5, according to some embodiments, in another aspect, the first connection portion 1444 can be used only for the circuitry to pass through, so the thickness of the first flexible circuit board 144 at the first connection portion 1444 can be reduced; that is, fewer conductive layers can be used to form required conductive lines for the circuitry. In other words, the thickness of the first connection portion 1444 can be less than the thickness of the first main portion 1442; the thickness of the first connection portion 1444 can be less than the thickness of the first extension portion 1446. For example, the number of layers of the first main portion 1442 (for example including but not limited to six conductive layers) is larger than the number of layers of the first connection portion 1444 (for example including but not limited to two conductive layers). The reduction in thickness is conducive to the bending of the first connection portion 1444 in the first slit 1426. Therein, for simplification of the drawing, the first flexible circuit board 144 in FIG. 5 is shown only by its profile, and the layered structure thereof is not shown in FIG. 5.

The second flexible circuit board 146 includes a second main portion 1462, a second connection portion 1464, and a second extension portion 1466. The second connection portion 1464 extends from the second main portion 1462; then, the second extension portion 1466 extends from the second connection portion 1464. In other words, the second connection portion 1464 connects the second main portion 1462 and the second extension portion 1466. The second main portion 1462 is disposed on the second area 14224. The second connection portion 1464 also passes through the first slit 1426. The second extension portion 1466 is disposed on the second surface 1424. The second light-emitting units 152 are disposed on the second main portion 1462 toward the display panel 12. The at least one second driver unit 158 is disposed on the second extension portion 1466 and is electrically connected to the second light-emitting units 152 through the second connection portion 1464, so that the at least one second driver unit 158 can drive and control the second light-emitting units 152 to emit light.

In some embodiments, similar to the first flexible circuit board 144, the second flexible circuit board 146 also can include a multilayer sheet. For other descriptions of the second flexible circuit board 146, please refer to the relevant descriptions of the first flexible circuit board 144, which will not be described repeatedly. Therefore, in the embodiment, the width 1462a of the second main portion 1462 in the first direction D1 can be larger than the width 1464a of the second connection portion 1464 in the first direction D1.

Figure 3:
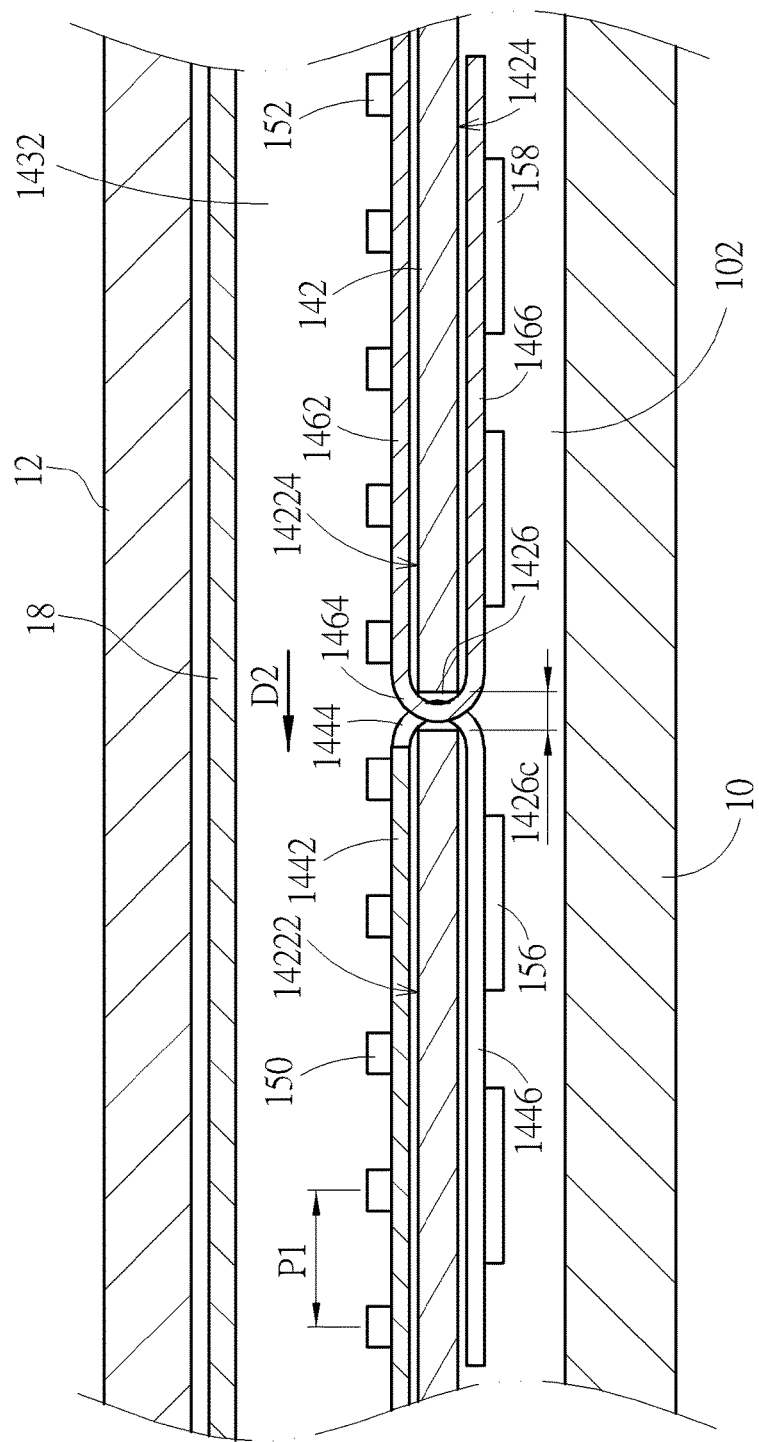
FIG. 3 is an enlarged view of a portion of FIG. 1.

According to some embodiments, as shown by FIG. 2 and FIG. 3, the first connection portion 1444 and the second connection portion 1464 are staggered in the first direction D1; that is, the first connection portion 1444 and the second connection portion 1464 pass through the first slit 1426 without overlapping in the first direction D1. In another aspect, the first connection portion 1444 passes through a first slit range 1426a of the first slit 1426; the second connection portion 1464 passes through a second slit range 1426b of the first slit. The first slit range 1426a and the second slit range 1426b do not overlap. Therefore, the first connection portion 1444 and the second connection portion 1464 will not push each other and can use the whole width 1426c of the first slit 1426.

Figure 6:
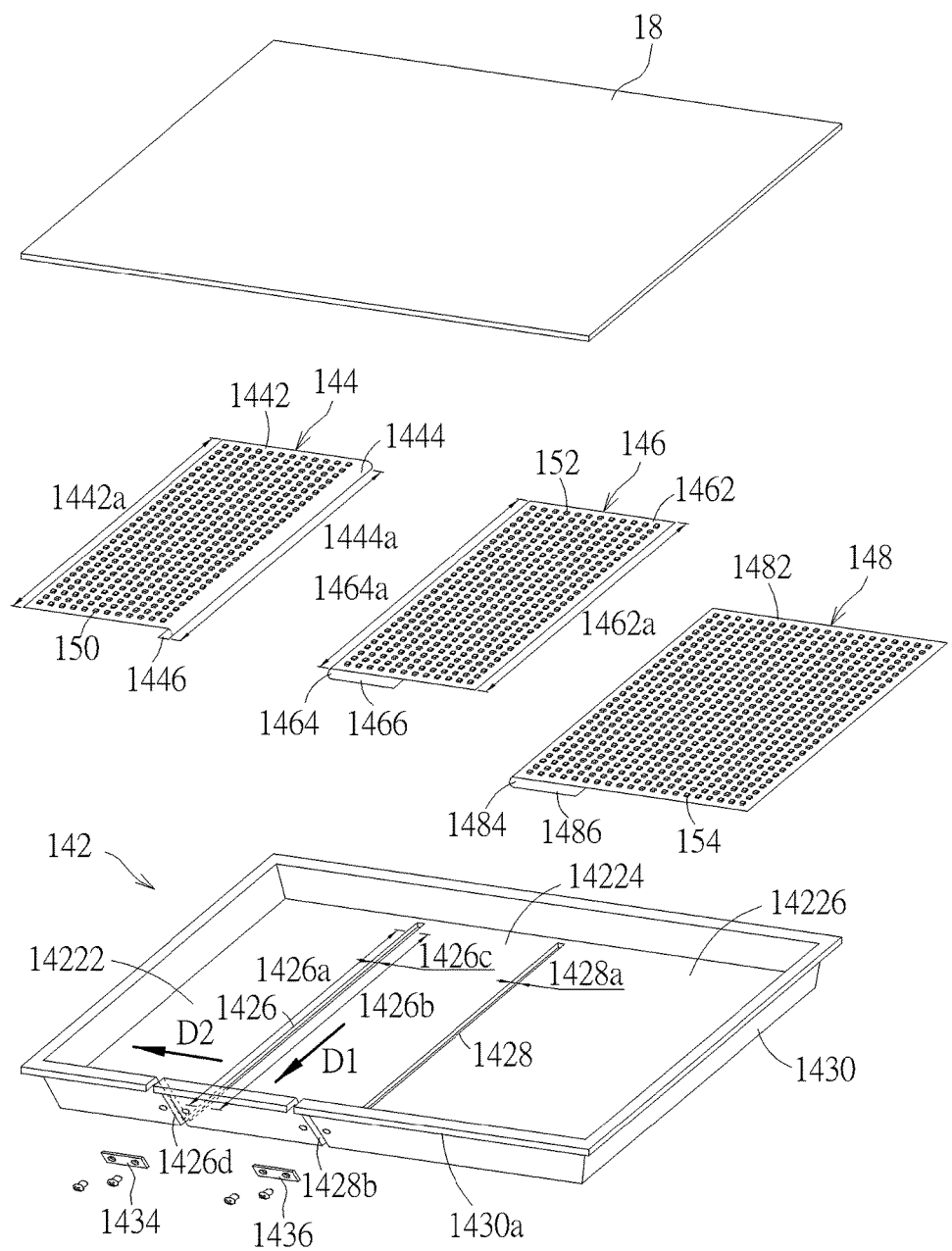
FIG. 6 is an exploded view of a backlight module of a display device according to an embodiment.
Figure 7:
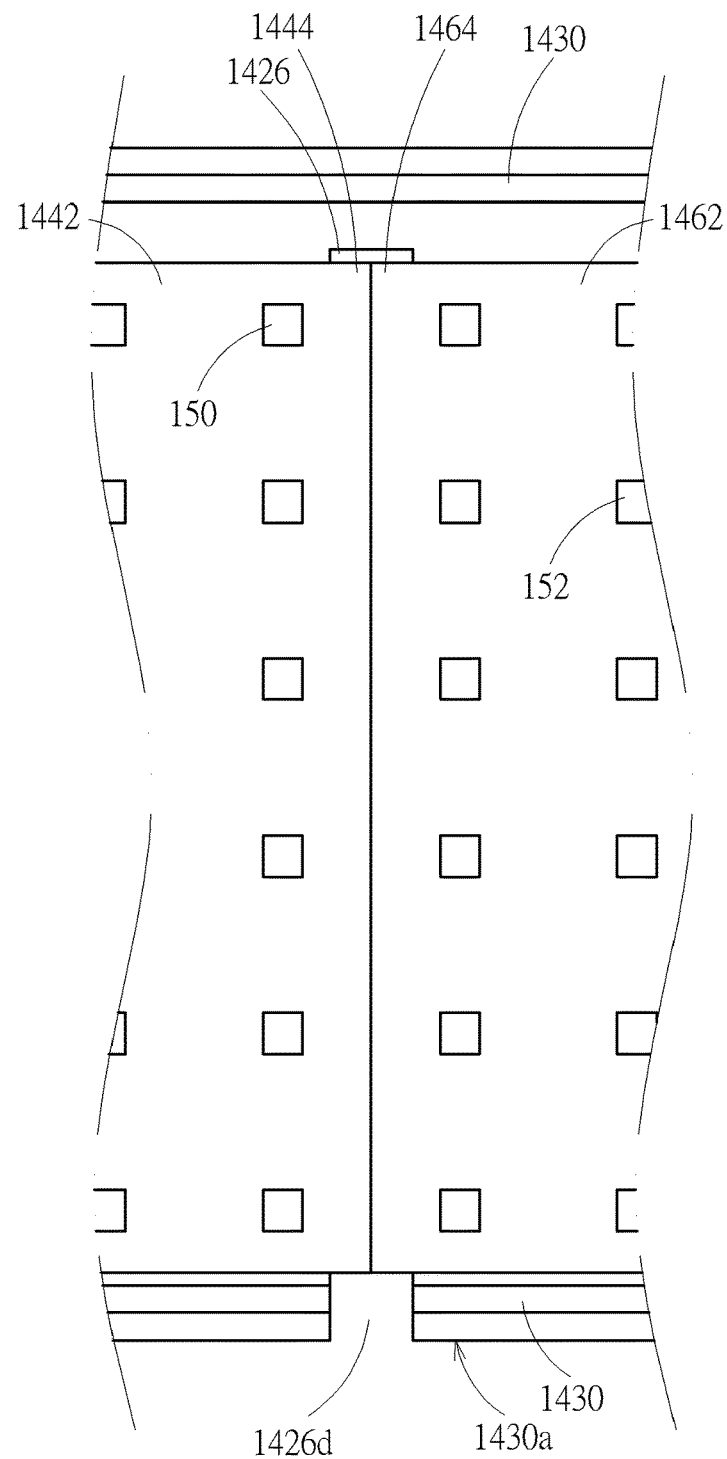
FIG. 7 is a top view of a portion of a heat dissipating plate onto which a first flexible circuit board and a second flexible circuit board are assembled in FIG. 6.

According to some other embodiments, as shown by FIG. 6 and FIG. 7 (wherein for simplification of the description, the first slit 1426, the first flexible circuit board 144, and the second flexible circuit board 146 are shown in an exaggerated scale in FIG. 7), the width 1444a of the first connection portion 1444 of the first flexible circuit board 144 and the width 1464a of the second connection portion 1464 of the second flexible circuit board 146 are substantially equal. The first slit range 1426a and the second slit range 1426b can be configured to substantially completely overlap (or have the same range). According to other embodiments, the first flexible circuit board 144 and the second flexible circuit board 146 can be assembled to the heat dissipating plate 142 in a way that the first slit range 1426a and the second slit range 1426b at least partially overlap.

Please refer back to FIG. 1 to FIG. 5. The third flexible circuit board 148 includes a third main portion 1482, a third connection portion 1484, and a third extension portion 1486. The third connection portion 1484 extends from the third main portion 1482; then, the third extension portion 1486 extends from the third connection portion 1484. In other words, the third connection portion 1484 connects the third main portion 1482 and the third extension portion 1486. The third main portion 1482 is disposed on the third area 14226. The third connection portion 1484 passes through the second slit 1428. The third extension portion 1486 is disposed on the second surface 1424. The third light-emitting units 154 are disposed on the third main portion 1482 toward the display panel 12. The at least one third driver unit 160 is disposed on the third extension portion 1486 and is electrically connected to the third light-emitting units 154 through the third connection portion 1484, so that the at least one third driver unit 160 can drive and control the third light-emitting units 154 to emit light.

In the embodiment, only the third connection portion 1484 passes through the second slit 1428, so the third flexible circuit board 148 has no width reduction of at the third connection portion 1484. In practice, the third flexible circuit board 148 can have thickness reduction at the third connection portion 1484, which is conducive to the bending of the third connection portion 1484 in the second slit 1428. In addition, in the embodiment, the third flexible circuit board 148 can use the whole length of the second slit 1428. That is, relative to the first flexible circuit board 144 or the second flexible circuit board 146, the third connection portion 1484 is allowed to contain more conductive lines for the circuitry. Therefore, more light-emitting units can be disposed on the third flexible circuit board 148; that is, the quantity of the third light-emitting unit 154 can be larger than the quantity of the first light-emitting units 150 or the second light-emitting units 152. In the embodiment, the area of the third main portion 1482 can be larger than the area of the first main portion 1442 or the second main portion 1462.

Furthermore, in the embodiment, the first light-emitting units 150, the second light-emitting units 152, and the third light-emitting units 154 as a whole are arranged in a single pitch P1 (as shown by FIG. 3) on the first main portion 1442, the second main portion 1462, and the third main portion 1482. The first slit 1426 has a minimum distance (i.e. equivalent to the width 1426c) in a second direction D2 (for example but not limited to a direction perpendicular to the first direction D1). The minimum distance can be less than or equal to a pitch (i.e. equivalent to the pitch P1) of any adjacent two of the first light-emitting units 150 in the second direction D2. In other words, the width 1426c of the first slit 1426 and the width 1428a of the second slit 1428 in the second direction D2 can be less than or equal to the pitch P1, so that the disposition of the first slit 1426 and the second slit 1428 does not affect the distribution of the first light-emitting units 150, the second light-emitting units 152, and the third light-emitting units 154 as a whole on the first surface 1422, which makes the backlight module 14 still can provide uniform backlight to the display panel 12. In some embodiments, the minimum distance can be equal to the pitch of the first light-emitting units 150 in the second direction D2.

In some embodiments, the pitch P1 can be 1 to 5 mm, for example 2 to 4 mm, for example 3 mm. The width 1426c of the first slit 1426 and the width 1428a of the second slit 1428 can be 0.5 to 3 mm, for example 0.5 to 2 mm, or 0.75 to 1.35 mm. The locations of the light-emitting units and the slits can be arranged such that there is a proper distance between the slits and the light-emitting units closest to the slits; for example the proper distance can be larger than 0.25 mm, be 0.25 to 1 mm, or be 0.25 to 0.5 mm. For example, the distance between the first slit 1426 and the first light-emitting unit 150 closest to the first slit 1426 can be 0.25 to 1 mm, or 0.25 to 0.5 mm; that is, the minimum distance of the first light-emitting units 150 and the first slit 1426 can be 0.25 to 1 mm, or 0.25 to 0.5 mm. Similarly, the minimum distance of the second light-emitting units 152 and the first slit 1426 can be 0.25 to 1 mm, or 0.25 to 0.5 mm. The minimum distance of the third light-emitting units 154 and the second slit 1428 can be 0.25 to 1 mm, or 0.25 to 0.5 mm.

In some embodiments, the thickness of the first main portion 1442 and the thickness of the first extension portion 1446 can be 0.3 to 1.5 mm, for example 0.3 to 1 mm, 0.3 to 0.8 mm, or 0.5 mm. The thickness of the first connection portion 1444 can be 0.05 to 0.25 mm, for example 0.05 to 0.2 mm, 0.1 to 0.2 mm, or 0.15 mm. In the embodiment, the design in the thickness of the second flexible circuit board 146 can be the same or similar to the thickness design of the first flexible circuit board 144 and will not be described in addition. Furthermore, in practice, the thickness design of the third flexible circuit board 148 can be also be the same or similar to the thickness design of the first flexible circuit board 144, which will not be described additionally. In addition, in practice, the first extension portion 1446, the second extension portion 1466, and the third extension portion 1486 will be connected to a power module or a processing module (not shown in the figures) of the display device 1. In addition, in practice, an edge of the first slit 1426 (i.e. the portion where the first surface 1422 and the second surface 1424 connects) can be formed in a rounded or chamfered structure, which can provide more space for the bending of the first connection portion 1444 and the second connection portion 1464. The above description is also applicable to the second slit 1428 and will not be repeated.

In addition, in the embodiment, the heat dissipating plate 142 has a peripheral wall 1430 at its periphery. The peripheral wall 1430 surrounds the first surface 1422. The optical film 18 is disposed on the peripheral wall 1430. An accommodating space 1432 is formed between the heat dissipating plate 142 and the optical film 18 (or the display panel 12). The first main portion 1442, the second main portion 1462, the third main portion 1482, the first light-emitting units 150, the second light-emitting units 152, and the third light-emitting units 154 are accommodated in the accommodating space 1432. The first light-emitting units 150, the second light-emitting units 152, and the third light-emitting units 154 are disposed at a distance to the optical film 18. The distance is conducive to enhancement of the uniformity of the backlight.

Furthermore, in the embodiment, for convenience of assembling the first flexible circuit board 144 and the second flexible circuit board 146 to the heat dissipating plate 142, as shown by FIG. 6, further, the first slit 1426 extends to the peripheral wall 1430 and has an opening 1426d in the first direction D1; that is, in the first direction D1, the first slit 1426 has an open end (i.e. the opening 1426d formed on the peripheral wall 1430) and a closed end. In another aspect, the heat dissipating plate 142 has the opening 1426d that is disposed at an edge 1430a of the heat dissipating plate 142 (i.e. equivalent to the periphery of the peripheral wall 1430); therein, the first slit 1426 extends along the first direction D1 to the edge 1430a and is connected to the opening 1426d. When in assembly, the first flexible circuit board 144 can be slid from the opening 1426d into the first slit 1426 through the first connection portion 1444, and then the second flexible circuit board 146 can be slid from the opening 1426d into the first slit 1426 through the second connection portion 1464. The assembly does not need to pass the first driver units 156 and the second driver unit 158 through the first slit 1426. Afterward, the first structural connecting part 1434 can be used to close the opening 1426d (for example with but not limited to screws for fixing); that is, the first structural connecting part 1434 connects the two portions of the heat dissipating plate 142 (or the peripheral wall 1430) at opposite sides of the opening 1426d, so that the structural strength of the heat dissipating plate 142 at the opening 1426d can be maintained. Similarly, in the embodiment, the backlight module 14 includes a second structural connecting part 1436. The second slit 1428 extends to the peripheral wall 1430 and has an opening 1428b in the first direction D1. After the third flexible circuit board 148 is assembled to the heat dissipating plate 142 (for example by sliding the third connection portion 1484 from the opening 1428b into the second slit 1428), the second structural connecting part 1436 can be used to close the opening 1428b (for example with but not limited to screws for fixing); that is, the second structural connecting part 1436 connects the two portions of the heat dissipating plate 142 (or the peripheral wall 1430) at opposite sides of the opening 1428b.

In the above embodiment, the heat dissipating plate 142 provides the first slit 1426 and the second slit 1428 to allow the first flexible circuit board 144, the second flexible circuit board 146, and the third flexible circuit board 148 to pass through. Thus, the at least one first driver unit 156 and the first light-emitting unit 150 can be disposed on two opposite sides of the heat dissipating plate 142. Similarly, the at least one second driver unit 158 and the second light-emitting unit 152 can be disposed on two opposite sides of the heat dissipating plate 142, and the at least one third driver unit 160 and the third light-emitting unit 154 can be disposed on two opposite sides of the heat dissipating plate 142. The first main portion 1442, the second main portion 1462, and the third main portion 1482 can remain laid flatly on the first area 14222, the second area 14224, and the third area 14226, without influence on the flat disposition of the first light-emitting units 150, the second light-emitting units 152, and the third light-emitting units 154 on the first surface 1422.

In some of the above embodiments, the driver unit can be disposed on the extension portion of the flexible circuit board after the flexible circuit board is bent. The driver unit does not occupy much space of the front of the flexible circuit board, so that the light-emitting units can be arranged flatly on the front of the flexible circuit board, so that the backlight module can provide uniform backlight to the display panel and the light-emitting units can obtain a good heat dissipation effect through the heat dissipating plate.

According to other embodiments, in practice, it is practicable to use an indentation structure on the heat dissipating plate to accommodate driver units. Thus, arrangement of the at least one first driver unit 156, the at least one second driver unit 158, and the at least one third driver unit 160 will not have influence on the flat disposition of the first light-emitting units 150, the second light-emitting units 152, and the third light-emitting units 154 on the first surface 1422. Please refer to FIG. 8 to FIG. 10. A display device 3 according to another embodiment is structurally similar to the display device 1. For simplification of the description, the display device 3 uses the reference numbers used by the display device 1 in principle. For other descriptions of the display device 3, please refer to the relevant descriptions of the components of the display device 1 in the same names.

Figure 8:
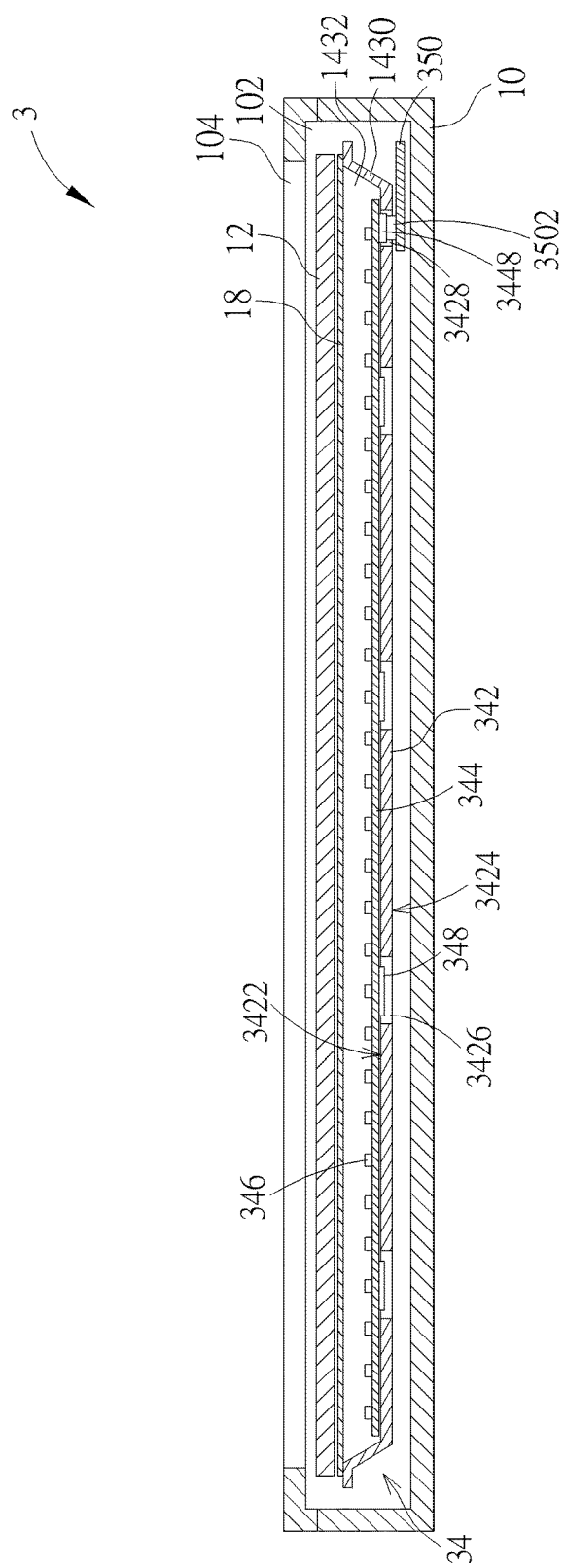
FIG. 8 is a sectional view of a display device according to an embodiment.
Figure 9:
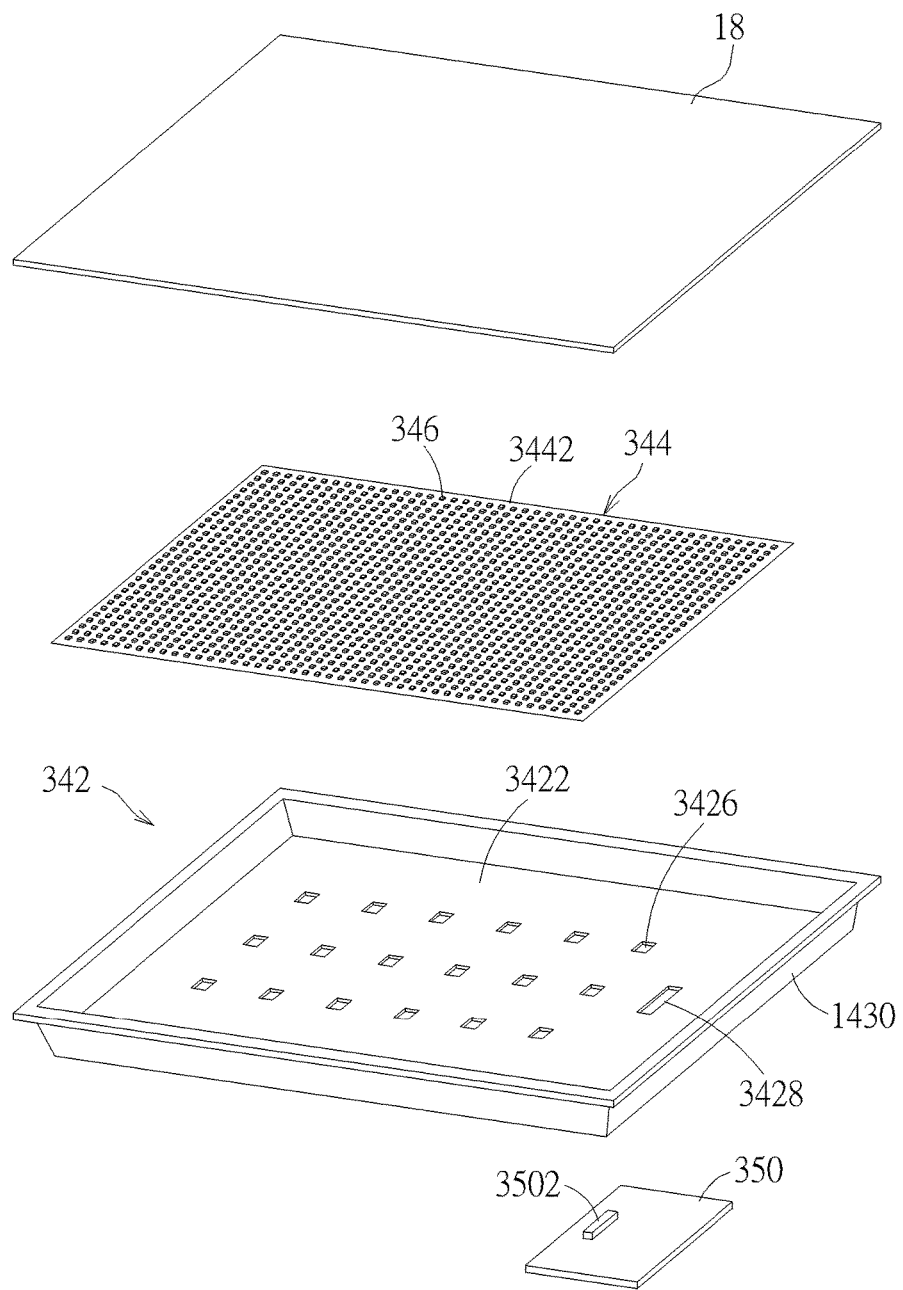
FIG. 9 is an exploded view of a backlight module in FIG. 8.
Figure 10:
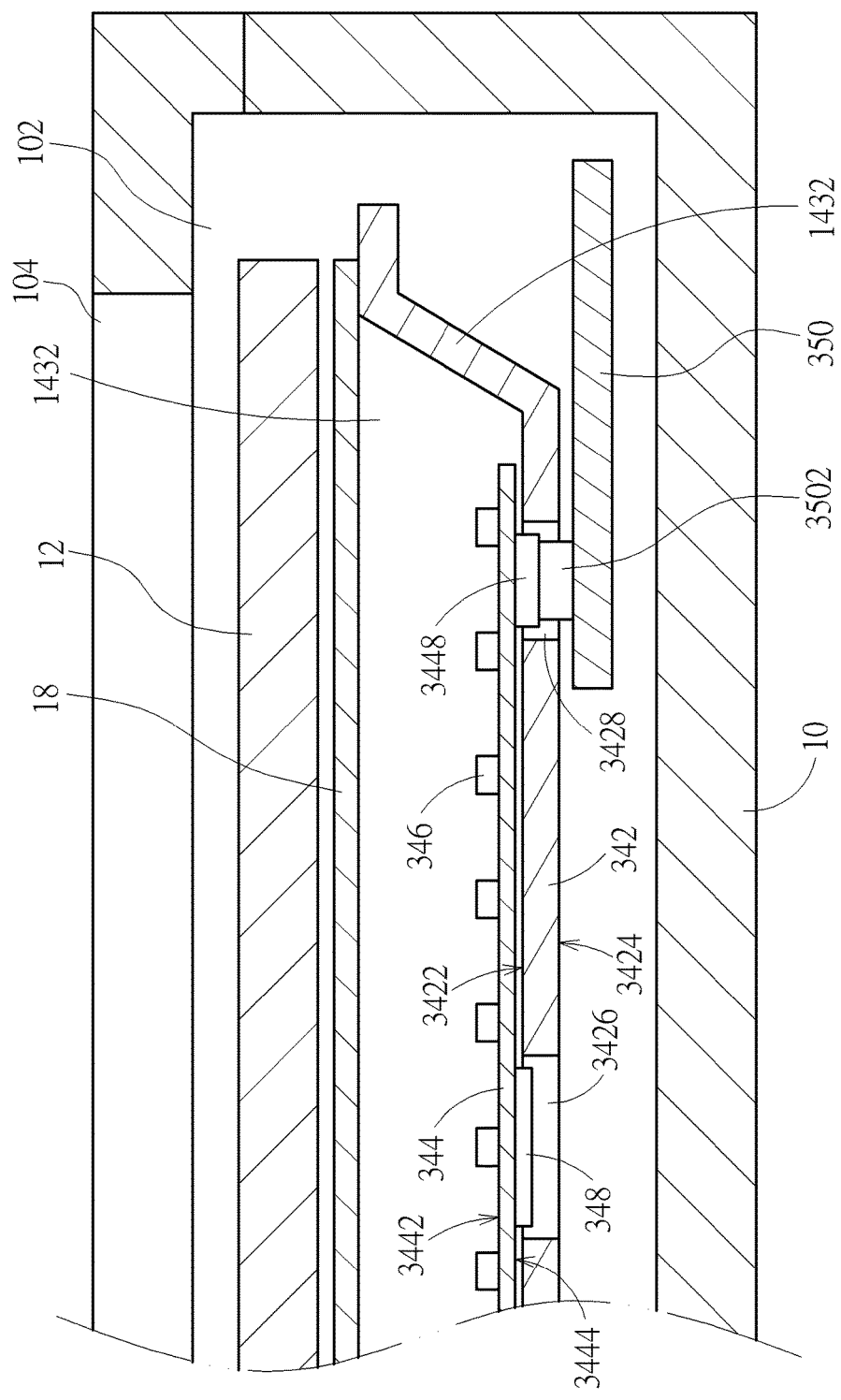
FIG. 10 is an enlarged view of a portion of FIG. 8.

Referring to FIG. 8 to FIG. 10, in the embodiment, the display device 3 includes a casing 10, a display panel 12, a backlight module 34, and an optical film 18. A main difference between the display device 3 and the display device 1 is that the backlight module 34 includes a heat dissipating plate 342 with an indentation structure. The heat dissipating plate 342 has a first surface 3422 toward the display panel 12, a second surface 3422 opposite to the first surface 3422, and at least one indentation structure 3426 on the first surface 3422. The flexible circuit board 344 has a third surface 3442 toward the display panel 12, and a fourth surface 3444 opposite to the third surface 3442. The flexible circuit board 344 is disposed on the first surface 3422, so that the third surface 3442 is toward the display panel 12 and the fourth surface 3444 is toward the first surface 3422. The light-emitting units 346 are disposed on the third surface 3442 toward the display panel 12. The at least one driver unit 348 is disposed on the fourth surface 3444 toward the first surface 3422 and is on a location corresponding to the at least one indentation structure 3426. Specifically, the at least one driver unit 348 is disposed in the at least one indentation structure 3426. The light-emitting units 346 are electrically connected to the at least one driver unit 348, so that the at least one driver unit 348 can drive and control the third light-emitting units 346 (for example but not limited to light-emitting diodes) to emit light. The indentation structure 3426 can provide space to accommodate the corresponding driver unit 348, so that the flexible circuit board 344 can remain laid flatly on the first surface 3422 and the light-emitting units 346 can be disposed flatly on the heat dissipating plate 12. In addition, in some embodiments, the indentation structure 3426 can be a through hole that passes through the heat dissipating plate 342. In addition, in some embodiments, the indentation structure 3426 can be a depression that does not pass through the heat dissipating plate 342.

Further, in the embodiment, the backlight module 34 includes a connection circuit board 350. The flexible circuit board 344 and the connection circuit board 350 are disposed at two opposite sides of the heat dissipating plate 342 (or the connection circuit board 350 is disposed on the second surface 3424). The heat dissipating plate 342 has a through hole 3428 that passes through the first surface 3422 and the second surface 3424. The flexible circuit board 344 and the connection circuit board 350 are electrically connected through board-to-board connectors 3448 and 3502 that are located in the through hole 3428. In practice, the connection circuit board 350 will be further connected to a power module or a processing module (not shown in the figures) of the display device 1.

In some of the above embodiments, the driver unit can be disposed in the indentation structure of the heat dissipating plate; thereby, the driver unit can occupy less space or occupy no space on the front of the flexible circuit board, so that the light-emitting units can be arranged flatly on the front of the flexible circuit board. Thus, the backlight module can provide uniform backlight to the display panel and the light-emitting units can obtain a good heat dissipation effect through the heat dissipating plate.

Figure 11:
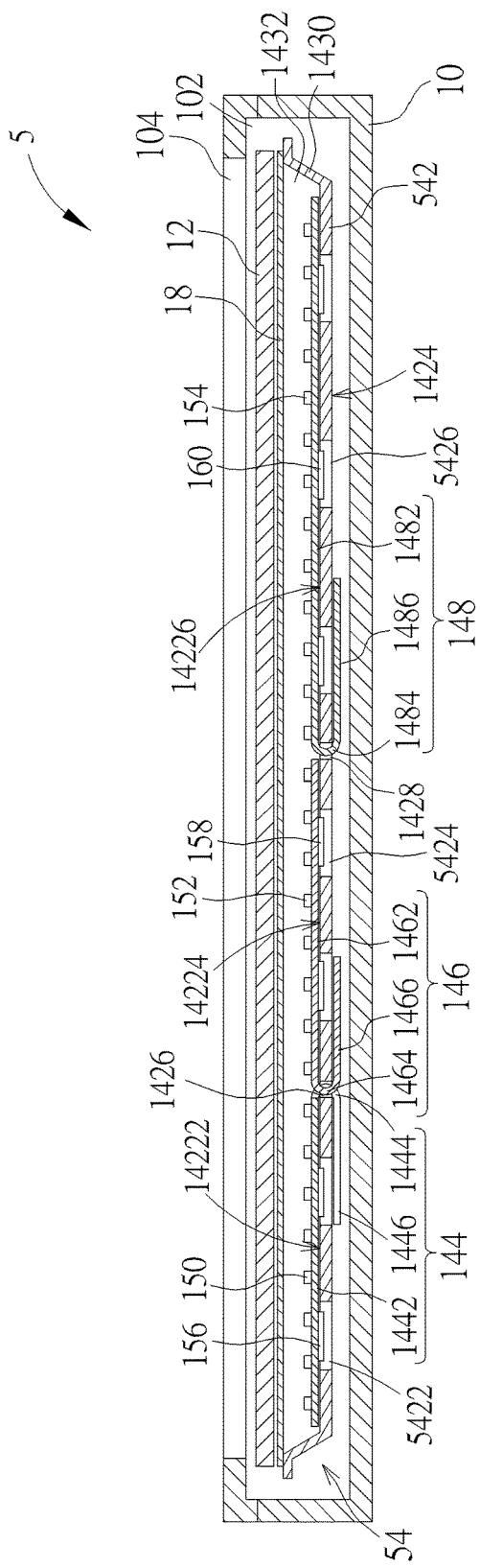
FIG. 11 is a sectional view of a display device according to an embodiment.
Figure 12:
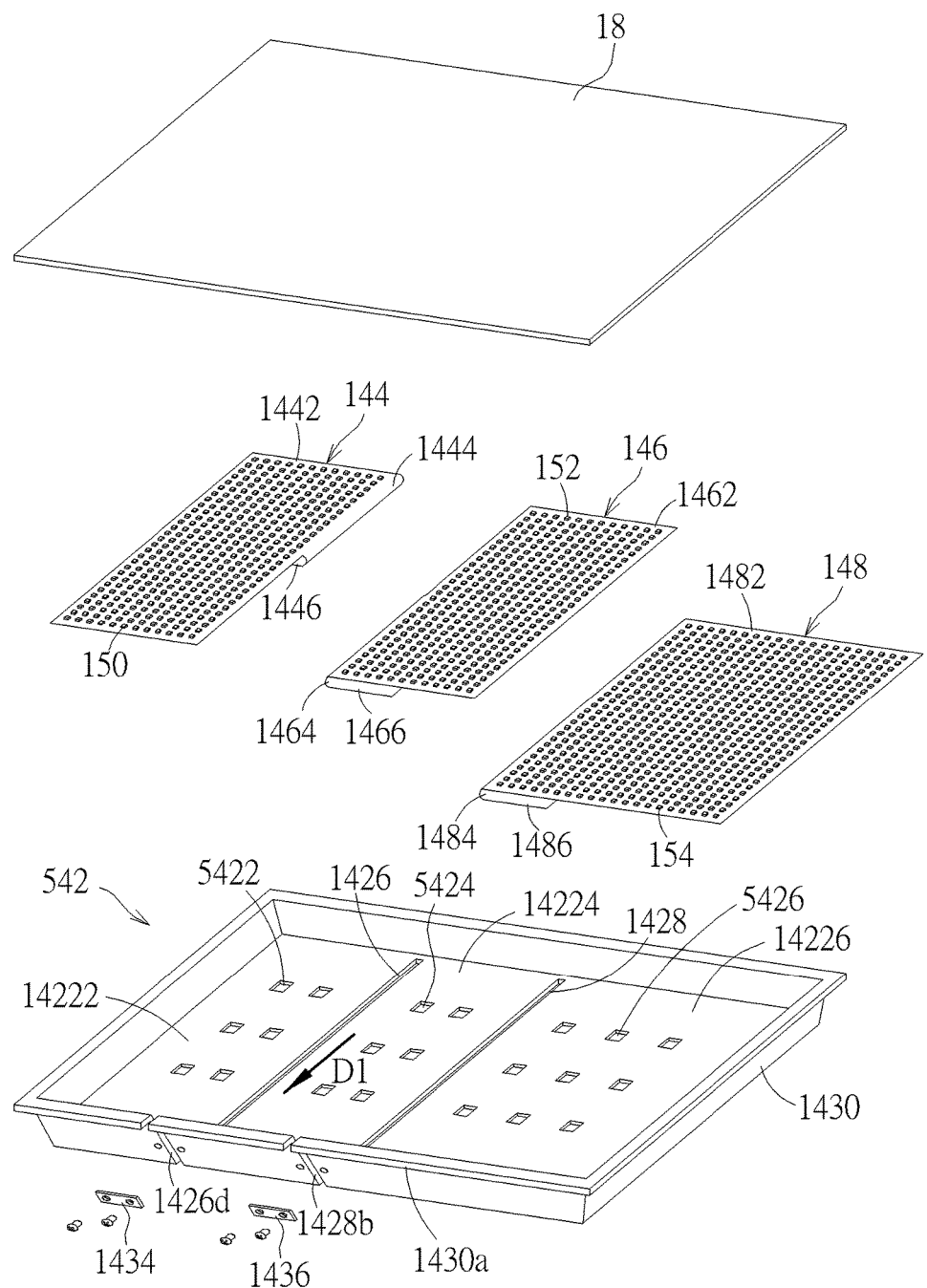
FIG. 12 is an exploded view of a backlight module in FIG. 11.
Figure 13:
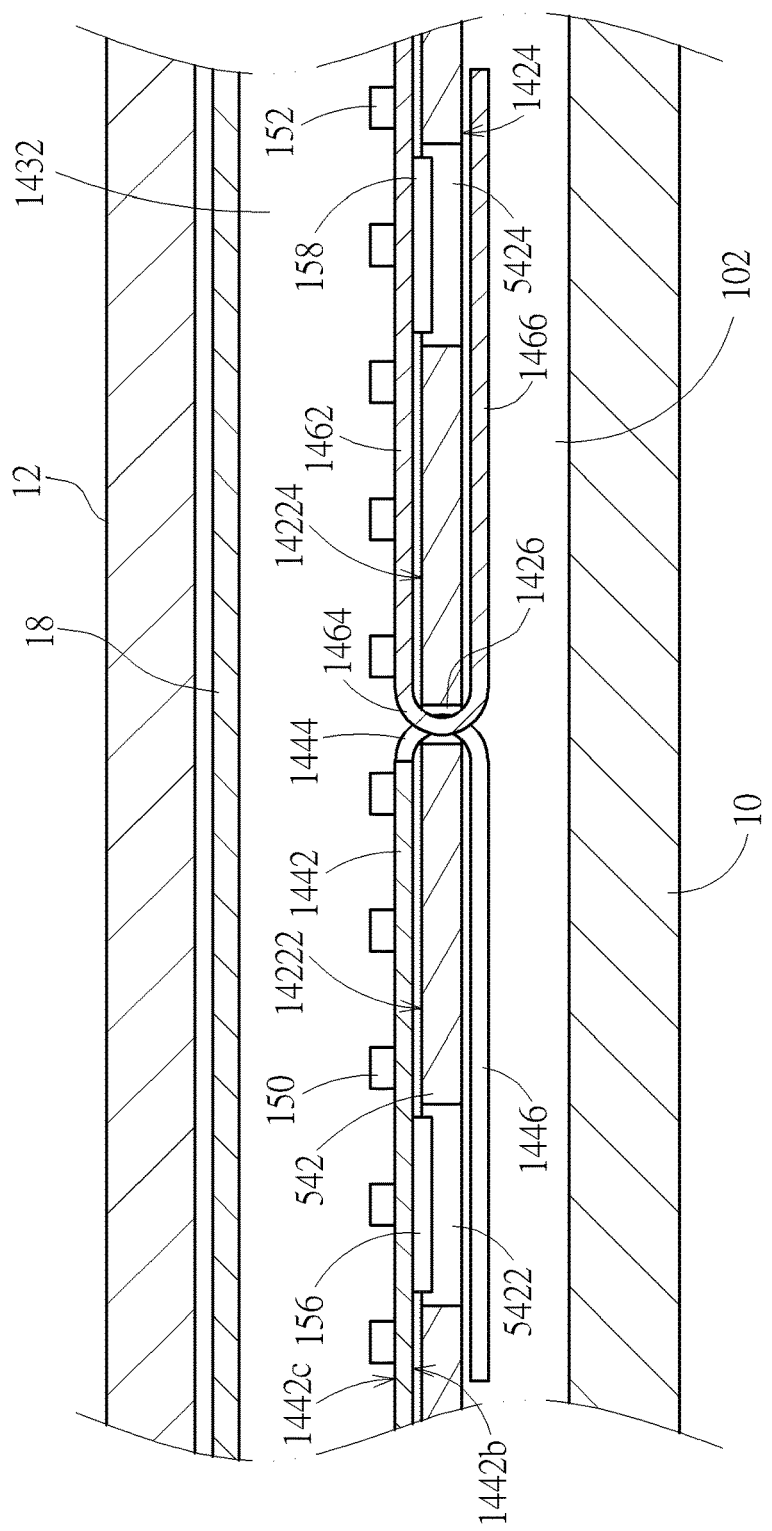
FIG. 13 is an enlarged view of a portion of FIG. 11.

For the above displays 1 and 3 in two structure designs, the flexible circuit boards can remain laid flatly on the heat dissipating plate and maintain the uniformity of backlight. In practice, according to some embodiments, a display device can combine the above-mentioned two structure designs. Please refer to FIG. 11 to FIG. 13. A display device 5 according to another embodiment includes a heat dissipating plate 542, which have a structure combining the structures of the heat dissipating plates 142 and 342 in the above-mentioned display device 1 and 3. For simplification of the description, the display device 5 uses the reference numbers used by the display device 1 in principle. For other descriptions of the display device 5, please refer to the relevant descriptions of the components of the display device 1 in the same names. A main difference between the display device 5 and the display device 1 is that a heat dissipating plate 542 of a backlight module 54 of the display device 5 further includes at least one first indentation structure 5422, at least one second indentation structure 5424, and at least one third indentation structure 5426. The at least one first indentation structure 5422 is located on the first area 14222. The at least one second indentation structure 5424 is located on the second area 14224. The at least one third indentation structure 5426 is located on the third area 14226. The at least one first driver unit 156 is disposed on the surface 1442*b* of the first main portion 1442 toward the first area 14222 and is correspondingly disposed in the at least one first indentation structure 5422. The first light-emitting units 150 are disposed on the surface 1442*c* of the first main portion 1442 toward the display panel 12. The at least one second driver unit 158 is disposed on the surface of the second main portion 1462 toward the second area 14224 and is correspondingly disposed in the at least one second indentation structure 5424. The second light-emitting units 152 are disposed on the surface of the second main portion 1462 toward the display panel 12. The at least one third driver unit 160 is disposed on the surface of the third main portion 1446 toward the third area 14226 and is correspondingly disposed in the at least one third indentation structure 5426. The third light-emitting units 154 are disposed on the surface of the third main portion 1482 toward the display panel 12. Similarly, the first indentation structure 5422, the second indentation structure 5424, and the third indentation structure 5426 can provide space to accommodate the first driver unit 156, the second driver unit 158, and the third driver unit 160 correspondingly, so the first main portion 1442, the second main portion 1462, and the third main portion 1482 can remain laid flatly on the first surface 3422, and the first light-emitting units 152, the second light-emitting units 154, and the third light-emitting units 156 can be arranged flatly on the heat dissipating plate 12. Furthermore, in the embodiment, the first indentation structure 5422, the second indentation structure 5424, and the third indentation structure 5426 can be a through hole independently, which passes through the heat dissipating plate 542. In addition, in some embodiments, the first indentation structure 5422, the second indentation structure 5424, and the third indentation structure 5426 can be a depression independently, which does not pass through the heat dissipating plate 542. In addition, in the embodiment, the first driver unit 156, the second driver unit 158, and the third driver unit 160 are not disposed on the first extension portion 1446, the second extension portion 1466, and the third extension portion 1486; however, the first driver unit 156, the second driver unit 158, and the third driver unit 160 still can be electrically connected to a power module or a processing module (not shown in the figures) of the display device 5 through the first extension portion 1446, the second extension portion 1466, and the third extension portion 1486.

Figure 14:
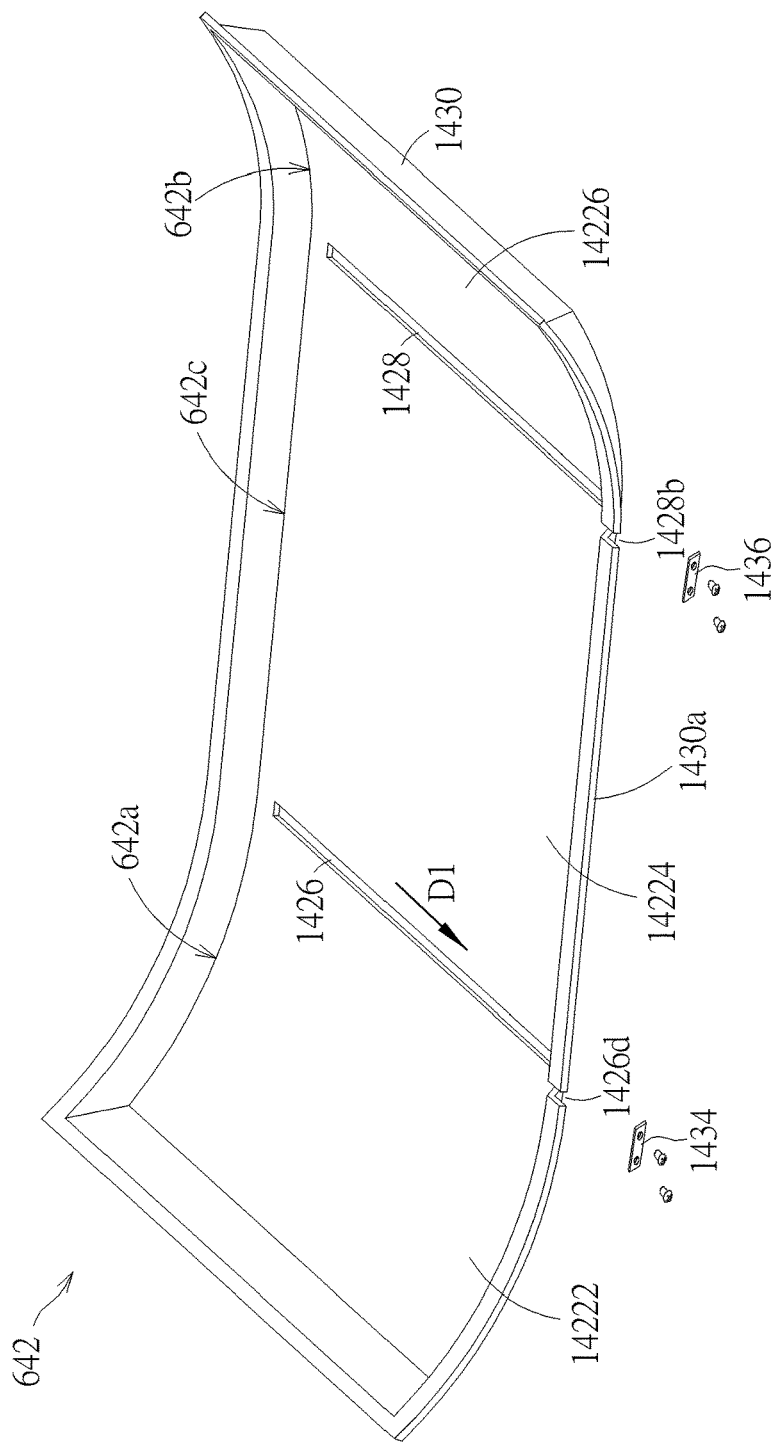
FIG. 14 is a schematic diagram illustrating a heat dissipating plate according to an embodiment.

In addition, in the above displays 1 and 5, the heat dissipating plates 142 and 542 show a plate structure (or a shallow-dish structure with the peripheral wall 1430). However, in practice, the heat dissipating plates 142 and 542 can be formed in an irregular structure. Please refer to FIG. 14, which is a schematic diagram illustrating a heat dissipating plate 642 according to another embodiment. The heat dissipating plate 642 is structurally similar to the heat dissipating plate 142, and therefore, the heat dissipating plate 642 uses the reference numbers used by the heat dissipating plate 142. For other descriptions of the heat dissipating plate 642, please refer to the relevant descriptions of the components of the heat dissipating plate 142 in the same names. A main difference between the heat dissipating plate 642 and the heat dissipating plate 142 is that the heat dissipating plate 642 has two bent portions 642*a* and 642*b* and a flat portion 642*c* between the bent portions 642*a* and 642*b*. The flat portion 642*c* connects with the bent portions 642*a* and 642*b*. In the embodiment, the first area 14222 and the third area 14226 are located at the bent portions 642*a* and 642*b* respectively. The second area 14224 is located at the flat portion 642*c*. The first slit 1426 is located where the bent portion 642*a* and the flat portion 642*c* are connected. The second slit 1428 is located where the bent portion 642*b* and the flat portion 642*c* are connected. In practice, the heat dissipating plate 642 can be designed to match with a display panel having a similar profile. By means of disposing the first slit 1426 and the second slit 1428 on the location where the flat portion and the bent portion connect, the presence of the slits will have less influence on the quality of images provided by the display panel.

In addition, in the above displays 1 and 5, the first flexible circuit board 144, the second flexible circuit board 146, and the third flexible circuit board 148 pass through the heat dissipating plates 142 and 542 through the first slit 1426 and the second slit 1428, so that the first flexible circuit board 144, the second flexible circuit board 146, and the third flexible circuit board 148 can be disposed on both opposite surfaces of the heat dissipating plates 142 and 542 simultaneously.

Figure 15:
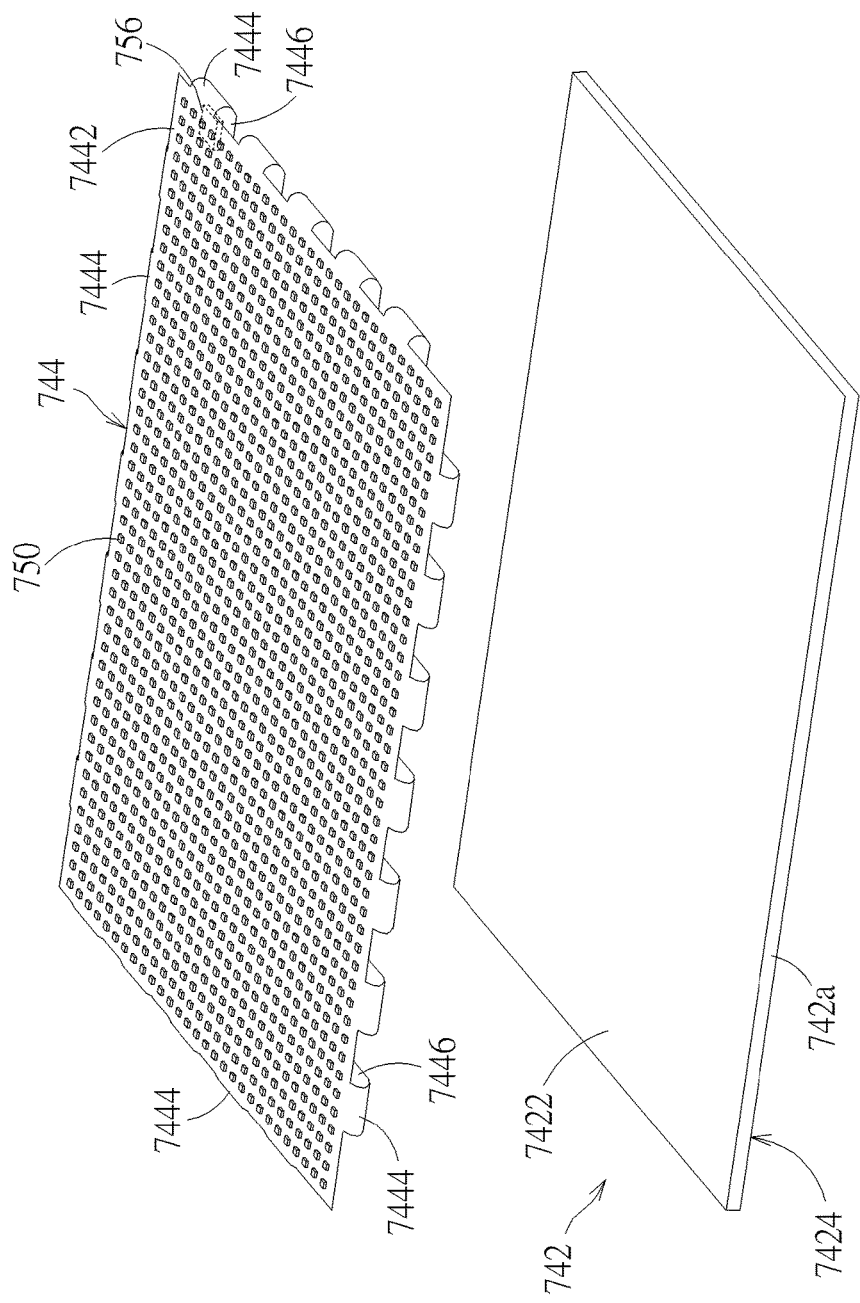
FIG. 15 is an exploded view of a heat dissipating plate and a flexible circuit board of a backlight module according to an embodiment.

According to other embodiments, in practice, instead of passing through a slit formed on the heat dissipating plate, the first flexible circuit board 144, the second flexible circuit board 146, and the third flexible circuit board 148 can be structurally modified so as to be disposed on the two opposite surfaces of the heat dissipating plates 142 and 542 by going around the heat dissipating plates 142 and 542. For example, please refer to FIG. 15, which is an exploded view of a heat dissipating plate 742 and a flexible circuit board 744 of a backlight module according to another embodiment. In the embodiment, the heat dissipating plate 742 has a first surface 7422 and a second surface 7424 opposite to the first surface 7422. The flexible circuit board 744 includes a main portion 7442 and a plurality of extension portions 7446. Each extension portion 7446 is connected to the main portion 7442 through a corresponding connection portion 7444. A plurality of light-emitting units 750 (for example but not limited to light-emitting diodes) are disposed on the main portion 7442. A corresponding driver unit 756 (for example but not limited to a driver chip) is disposed on each extension portion 7446; one driver unit 756 is shown by its profile in hidden lines in the figure for an example. The main portion 7442 is disposed on the first surface 7422. The extension portions 7446 goes around the periphery 742a of the heat dissipating plate 742 through the corresponding connection portions 7444 to be disposed on the second surface 7424. Therefore, in the embodiment, the flexible circuit board 744 also can be disposed on the two opposite surfaces of the heat dissipating plate 742, so that the main portion 7442 with the light-emitting units 750 disposed thereon can be disposed flatly on the first surface 7422 and then the light-emitting units 750 can provide uniform backlight and obtain a good heat dissipation effect through the heat dissipating plate 742. In practice, a display can be provided by the display device 1 with replacing the backlight module 14 with the backlight module of the embodiment. For other descriptions of this display, please refer to the relevant descriptions of the display device 1, which will not be described repeatedly.

As discussed above, in some embodiments, the driver unit can be disposed on the extension portion of the flexible circuit board after the flexible circuit board is bent, so that the driver unit will not occupy much space of the front of the flexible circuit board. In some embodiments, the driver unit can be disposed in the indentation structure of the heat dissipating plate, so that the driver unit will not occupy the front of the flexible circuit board. In some embodiments, some driver units can be disposed on the extension portion of the flexible circuit board after the flexible circuit board is bent, and some driver units can be disposed in the indentation structure of the heat dissipating plate, so that the driver units will not occupy much space of the front of the flexible circuit board. According to the above embodiments, the light-emitting units can be arranged flatly on the front of the flexible circuit board, so that the backlight module can provide uniform backlight to the display panel and obtain a good heat dissipation effect through the heat dissipating plate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
   a backlight module; and
   a display panel disposed on the backlight module;
   wherein the backlight module comprises:
   a heat dissipating plate having a first surface toward the display panel, a second surface opposite to the first surface, a slit passing through the first surface and the second surface, and an opening, the opening being disposed at an edge of the heat dissipating plate, the slit extending along a first direction to the edge and being connected to the opening;
   a first flexible circuit board, comprising a first main portion, a first extension portion, and a first connection portion connecting the first main portion and the first extension portion, the first main portion being disposed on the first surface, the first extension portion being disposed on the second surface, the first connection portion passing through the slit; and
   a plurality of first light-emitting units, disposed on the first main portion.

2. The display device of claim 1, wherein the backlight module further comprises a second flexible circuit board, the second flexible circuit board comprises a second main portion, a second extension portion, and a second connection portion, the second main portion is disposed on the first surface, the second extension portion is disposed on the second surface, the second connection portion connects the second main portion and the second extension portion and passes through the slit, the first connection portion passes through a first slit range of the slit, and the second connection portion passes through a second slit range of the slit.

3. The display device of claim 2, wherein the first slit range and the second slit range do not overlap.

4. The display device of claim 2, wherein the first slit range and the second slit range at least partially overlap.

5. The display device of claim 1, wherein the first flexible circuit board is a multilayer sheet, and a number of layers of the first main portion is larger than a number of layers of the first connection portion.

6. The display device of claim 1, wherein the slit has a minimum distance in a second direction, and the minimum distance is less than or equal to a pitch of any adjacent two of the first light-emitting units in the second direction.

7. The display device of claim 1, wherein the backlight module further comprises a driver unit, and the driver unit is disposed on the first extension portion of the first flexible circuit board.

8. The display device of claim 7, wherein the backlight module comprises a plurality of the driver units, the first flexible circuit board comprises a plurality of the first extension portions, and the driver units are disposed on the first extension portions respectively.

9. The display device of claim 1, wherein the backlight module further comprises a driver unit, the heat dissipating plate further has an indentation structure on the first surface, the first main portion of the first flexible circuit board has a third surface toward the display panel, and a fourth surface opposite to the third surface, the first light-emitting units are disposed on the third surface, and the driver unit is disposed on the fourth surface and in the indentation structure.

10. A display device, comprising:
    a backlight module; and
    a display panel disposed on the backlight module;
    wherein the backlight module comprises:
    a heat dissipating plate having a first surface toward the display panel, a second surface opposite to the first surface, and an indentation structure located on the first surface, the indentation structure being a depression not passing through the heat dissipating plate;
    a first flexible circuit board, having a third surface toward the display panel, and a fourth surface opposite to the third surface;
    a plurality of first light-emitting units, disposed on the third surface; and
    a driver unit, disposed on the fourth surface and in the indentation structure.

* * * * *